(12) United States Patent
Koschan et al.

(10) Patent No.: US 8,278,624 B2
(45) Date of Patent: Oct. 2, 2012

(54) LUTETIUM OXYORTHOSILICATE SCINTILLATOR HAVING IMPROVED SCINTILLATION AND OPTICAL PROPERTIES AND METHOD OF MAKING THE SAME

(75) Inventors: Merry A. Koschan, Maryville, TN (US); Charles L. Melcher, Oak Ridge, TN (US); Piotr Szupryczynski, Knoxville, TN (US); A. Andrew Carey, Lenoir City, TN (US)

(73) Assignees: Siemens Medical Solutions USA, Inc., Malvern, PA (US); University of Tennessee Research Foundation, Knoxville, TN (US)

( * ) Notice: Subject to any disclaimer, the term of this patent is extended or adjusted under 35 U.S.C. 154(b) by 985 days.

(21) Appl. No.: 11/842,813

(22) Filed: Aug. 21, 2007

(65) Prior Publication Data
US 2011/0260107 A1 Oct. 27, 2011

Related U.S. Application Data

(60) Provisional application No. 60/839,062, filed on Aug. 21, 2006, provisional application No. 60/905,342, filed on Mar. 7, 2007, provisional application No. 60/905,351, filed on Mar. 7, 2007.

(51) Int. Cl.
*G01T 1/20* (2006.01)
*C09K 11/08* (2006.01)
*C30B 15/00* (2006.01)

(52) U.S. Cl. ........ 250/361 R; 250/370.11; 252/301.4 F; 117/19

(58) Field of Classification Search .............. 250/361 R, 250/370.11; 252/301.4 F; 117/19
See application file for complete search history.

(56) References Cited

U.S. PATENT DOCUMENTS

| 6,437,336 B1 * | 8/2002 | Pauwels et al. ........... 250/361 R |
| 6,967,330 B1 * | 11/2005 | Lempicki et al. ......... 250/361 R |
| 7,132,060 B2 | 11/2006 | Zagumennyi et al. |
| 7,651,632 B2 | 1/2010 | Ferrand et al. |
| 2006/0266276 A1 | 11/2006 | Shimura et al. |
| 2006/0266945 A1 | 11/2006 | Kurashige et al. |

FOREIGN PATENT DOCUMENTS
WO 2006018586 2/2006

OTHER PUBLICATIONS

Zavartsev et al., Czochralski growth and characterisation of large Ce3+:Lu2SiO5 single crystals co-doped with Mg2+ or Ca2+ or Tb3+ for scintillators, Journal of Crystal Growth, Jan. 1, 2005, pp. e2167-e2171. vol. 275, Elsevier B.V.

* cited by examiner

*Primary Examiner* — David Porta
*Assistant Examiner* — Faye Boosalis
(74) *Attorney, Agent, or Firm* — Peter Kendall (57) ABSTRACT

LSO scintillation crystals with improved scintillation and optical properties are achieved by controlled co-doping a LSO crystal melt with amounts of cerium and an additional codopant such as calcium or other divalent cations. Crystal growth atmosphere is optimized by controlling the amount of oxygen in the atmosphere. Zinc is added as an additional material to restabilize crystal growth where calcium co-dopant is added. The decay time of the scintillation crystal can be controlled by controlling the concentration of co-dopant added.

31 Claims, 8 Drawing Sheets

Radioluminescence emission spectra of LSO:Ce and LSO:Ce,Ca crystals excited with 30 keV x-rays.

Fig. 1. Radioluminescence emission spectra of LSO:Ce and LSO:Ce,Ca crystals excited with 30 keV x-rays.

Fig. 2. Pulse height spectrum of a $^{137}$Cs source using a crystal with 0.1% Ce and 0.1% Ca doping. The FWHM at 662 keV is 7.7%.

Fig. 3. Absolute light output as a function of Ca concentration in the melt

Fig. 4. Scintillation decay of LSO:Ce crystals with 0, 0.1, 0.2, 0.3, and 0.4% Ca doping. All samples had single exponential decays with no long components.

Fig. 5. Decay time as a function of Ca concentration in the melt.

Fig. 6. Decay time vs. light output for crystals doped with 0.1% Ce.

Fig. 7. Light output for crystals grown with various amounts of oxygen in the growth atmosphere.

FIG. 8

LUTETIUM OXYORTHOSILICATE SCINTILLATOR HAVING IMPROVED SCINTILLATION AND OPTICAL PROPERTIES AND METHOD OF MAKING THE SAME

CROSS-REFERENCE TO RELATED APPLICATIONS AND CLAIM FOR PRIORITY

This application is a non-provisional of and claims priority under 35 U.S.C. §119(e) from provisional application Ser. No. 60/839,062, filed Aug. 21, 2006, entitled Method For Improving the Scintillation and Optical Properties of Lutetium Oxyorthosilicate (LSO); provisional application Ser. No. 60/905,342, filed Mar. 7, 2007, entitled Method for Control of Scintillation Decay Time in Inorganic Scintillators; and provisional application Ser. No. 60/905,351. filed Mar. 7, 2007, entitled Suppression of Growth Instability in Inorganic Scintillators.

TECHNICAL FIELD

In general, the invention relates to scintillator crystal materials, which find use in nuclear imaging applications across multiple disciplines, and in particular in nuclear medical imaging applications such as Positron Emission Tomography (PET), Single Photon Emission Computed Tomography (SPECT), or planar nuclear medical imaging. More particularly, the invention relates to improvements in the properties of lutetium oxyorthosilicate (LSO) by new methods of crystal growth.

BACKGROUND OF THE INVENTION

Lutetium oxyorthosilicate (LSO) or $Lu_2SiO_5$, invented by present co-inventor Charles L. Melcher and described in U.S. Pat. No. 4,958,080, incorporated by reference herein in its entirety, is a well-known crystal scintillator material that is widely used for gamma-ray detection in PET as well as other applications.

LSO is typically doped with 0.05-0.5% Ce, while controlling other impurities at low levels. The development of cerium-doped LSO in the early 1990s represented a significant advance in inorganic scintillators for medical imaging. With its 7.4 $g/cm^3$ density, high light yield, and fast decay time (~45 ns), LSO is widely regarded as the best detector material available for PET. Since the time that LSO went into large-scale commercial production in the late 1990s there has been a significant effort by the present inventors and others to improve the scintillation properties of LSO.

In particular, the conventional method of LSO crystal growth used cerium doping alone (i.e. without any codopant), at relatively high cerium concentrations. Additionally, LSO growth methods typically utilized a crystal growth atmosphere consisting primarily of nitrogen, which resulted in undesired formation of oxygen vacancies and other defects associated with insufficient amounts of oxygen. It is also known that the light yield of LSO crystals as grown using prior art methods is on average significantly lower than the theoretical maximum, and the decay time of these crystals tended to vary.

Additionally, there exists a need for improvement in the decay time of LSO, especially in light of new techniques developed for image data acquisition such as Time-Of-Flight PET (TOF-PET). Further, so-called "phoswich" (or phosphorescence sandwich) detectors that often suffer from mismatched light outputs, mismatched indices of refraction, or the undesired absorption of scintillation light from one scintillator by the other, could be improved by such improved LSO scintillators.

The scintillation properties of LSO grown under such conditions can vary significantly from boule to boule, and in different parts of the same boule, which consequently increased the cost of commercial crystal production caused by the large number of out-of-spec crystals produced.

Considerable work has been done in recent years by a number of researchers on the use of codoping to improve the scintillation properties or growth of various inorganic scintillators, including doping of gallium garnets with divalent elements in order to suppress spiral growth, or with tetravalent dopants to decrease absorption loss. $Y_3Al_5O_{12}$:Ce has been doped with $Ca^{2+}$ to control oxygen vacancies, as described by Rotman et al. in *J. Appl. Phys.* vol. 71, no. 3, pp. 1209-1214, February 1992, incorporated herein by reference. Both divalent and tetravalent dopants have been used in the growth of $LuAlO_3$:Ce, as described by Derdzyan et al. in *Nucl. Instr. Meth. Phys. Res. A.* 537, pp. 200-202 (2005), incorporated herein by reference. LSO:Ce has been doped with 0.02% $Ca^{2+}$ or $Mg^{2+}$, as described in Zavartsev et al, "Czochralski growth and characterization of large $Ce^{3+}$:$Lu_2SiO_5$ single crystals co-doped with $Mg^{2+}$ or $Ca^{2+}$ or $Tb^{3+}$ for scintillators," J. Crystal Growth vol. 275, pp. e2167-e2171, 2005, incorporated herein by reference. Zavartsev et al. reported some improvement in light yield, though no change in decay time, relative to LSO:Ce with no co-doping.

Zagumennyi et al., U.S. Pat. No. 7,132,060, incorporated herein by reference, disclosed a scintillation substance composition in the form of a single crystal represented by the formula $Ce_xLu_{2+2y-x-z}A_zSi_{1-y}O_{5+y}$, where A is an element selected from Gd, Sc, Y, La, Eu, Tb and Ca, and where x is between $1 \times 10^{-4}$ and 0.2 f.u., y is between 0.024 and 0.09 f.u., and z is between $1 \times 10^{-4}$ and 0.05 f.u (it is noted that the disclosed formula is not enabled for Ca as the resulting compound would not be charge balanced).

There remains a need in the art for further improvements in the growth of LSO crystals, for example, to improve coincidence timing characteristics in PET imaging applications, to increase the scintillation light yield and improve light yield uniformity, improve energy resolution, achieve the ability to modify scintillation decay time as desired for particular applications and improve decay time uniformity, compensate for negative effects of lattice defects and traps, and to reduce or eliminate the occurrence of undesired color centers.

SUMMARY OF THE INVENTION

The present invention provides an improved process for growing LSO scintillation crystals and resulting improved LSO scintillation crystals. The inventive process involves co-doping an LSO:Ce melt with $Ca^{2+}$ in a range of 0.05-0.4% or higher depending upon the particular growth station used. These doping levels achieve significant changes in scintillation properties, both in improved light yield and faster decay time. Further, in accordance with the invention LSO crystals may be manufactured with "tunable" or predetermined, controlled decay times, by varying the amount of calcium co-doping. The use of zinc (or other divalent cations such as Cd, Pb and Sn) as an additional co-dopant to stabilize growth in the presence of calcium as a co-dopant is also provided according to the invention. The invention improves crystal uniformity, achieves crystals with a significantly reduced decay time, and consistently higher light output.

BRIEF DESCRIPTION OF THE DRAWINGS

The invention will become more clearly understood from the following detailed description in connection with the accompanying drawings, in which.

DETAILED DESCRIPTION OF THE INVENTION

As compared to the first generation LSO crystals, the present invention uses a combination of lower cerium doping, additional doping with calcium and/or other elements (such as zinc to stabilize crystal growth), and a growth atmosphere with a specific ratio of oxygen to an inert gas such as nitrogen or argon.

According to a first embodiment of the invention, the well-known Czochralski technique (in which large single crystals are "pulled" from molten raw material) was used to grow cerium-doped LSO (LSO:Ce) and LSO:Ce,Ca single crystal boules. The boules were grown from 60 mm diameter x 60 mm tall iridium crucibles that were inductively heated by an 8 kHz power supply. The flowing atmosphere was bulk nitrogen mixed with a fraction of a percent of oxygen. The oxygen concentration was controlled at various levels up to 0.15% and was monitored continuously by a residual gas analyzer. It is anticipated that other concentrations levels of oxygen also may work as well, within the range of 0.1-5%. Starting materials of $Lu_2O_3$, $SiO_2$, $CeO_2$, and CaO in powder form were at least 99.99% pure, and the same concentration of the Ce dopant (0.1%) was used for all growth runs.

Herein, the common practice will be used of stating the atomic percentage of the dopant concentration relative to lutetium in the melt from which the crystal was grown. The actual concentration of the dopant in the crystal will differ from this value due to solid-liquid segregation and the fraction of melt solidified, as discussed further below. Crystal growth was initiated with seed crystals, and the growth was controlled via an automated system that used the derivative of the crystal weight as the process variable. The crystals were cooled in the growth chamber in the same atmosphere.

The boules were 32 mm in diameter and ~100 mm long. Measurements were carried out on 2×10×10 mm unpolished samples. The cut surfaces had a smooth ground appearance, and the samples were cleaned but not processed further prior to measurement.

Both relative and absolute light output measurements were carried out after storage of the crystals in the dark for at least 24 hours. For the relative measurements, a crystal was placed directly onto a Hamamatsu R877 photomultiplier tube with no optical grease or other coupling material. The crystal was covered with a loose fitting Teflon cap to enhance the light collection efficiency. The crystal was excited with 662 keV gamma rays from a 5 µCi $^{137}Cs$ source located ~10 mm from the crystal surface. The natural background spectrum from the crystal was not subtracted. The light output was repeatable to within +/−3%. Absolute light output was measured with a 1.0 µCi $^{22}Na$ source and a Hamamatsu R2059 photomultiplier. In this case, the crystal was coupled with optical grease and tightly covered with a Tetratex TX3104 PTFE membrane to enhance the light collection efficiency. The pulse height was compared to the pulse height of single photoelectrons to determine the photoelectron yield per unit gamma ray energy. The quantum efficiency curve of the photomultiplier and the emission spectrum of the scintillator were used to calculate the number of photons per unit gamma ray energy, assuming full light collection.

To measure the scintillation decay time, the time-correlated single photon technique originated by Bollinger and Thomas was used. Decay time measurements on an individual sample were repeatable within +/−0.5 ns, while multiple samples within a boule had a standard deviation of ~1 ns.

X-ray stimulated emission spectra were measured at room temperature under irradiation from a Source 1 X-ray Model CMX003 X-ray generator. This generator uses an X-ray tube with a tungsten target operating at 30 kV and 150 µA. The emission spectra were recorded using a 150 mm focal length monochromator, model PI Acton SpectraPro SP-2155, with a 600 G/mm ruled grating and 500 nm blaze wavelength.

As shown in Equation 1, the distribution coefficient k may be determined from the measured dopant concentration $C_s$ near the end of the crystal boule and the dopant concentration $C_o$ in the initial melt composition, where g represents the fraction of the melt that has been crystallized.

$$C_s = kC_0(1-g)^{k-1} \quad (1)$$

The Ca and Ce concentrations were measured by Glow Discharge Mass Spectrometry (GDMS) near the bottoms of two boules grown from melts with 0.1% Ca and 0.1% Ce (percentages given in atomic percent). The distribution coefficient of Ca was found to be ~0.2, and the distribution coefficient of Ce was ~0.16, which is lower than the prior value for Ce in LSO, which was 0.22. An influence of Ca co-doping on Ce distribution cannot be ruled out, but requires further investigation.

Figure 1:
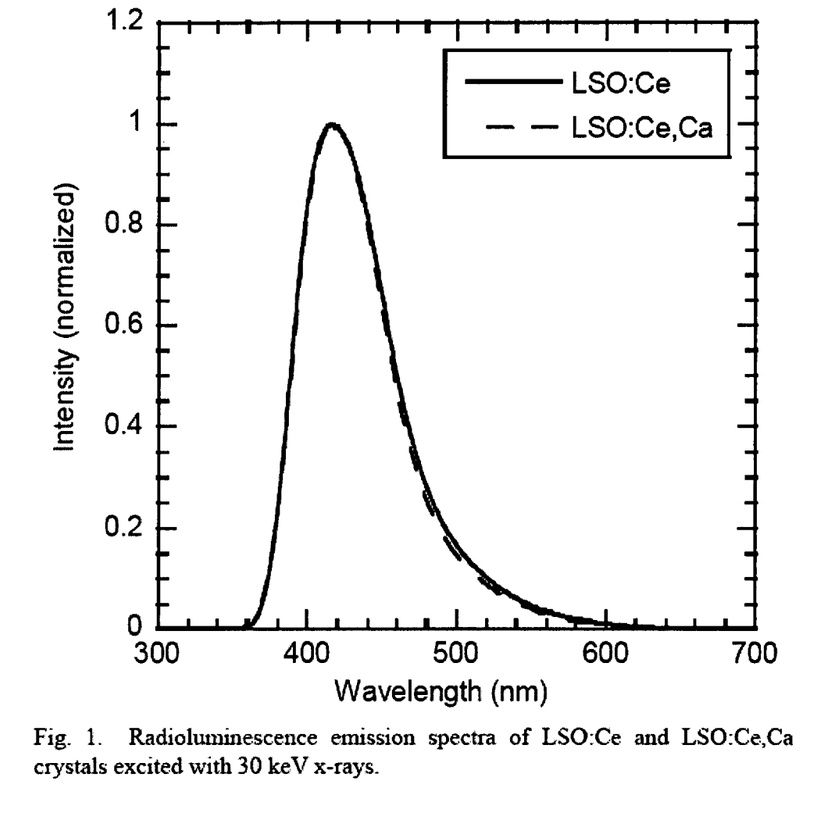
FIG. 1 is a graph showing comparison of LSO:Ce and LSO:Ce, Ca radioluminescence spectra.

The emission spectra of LSO:Ce and LSO:Ce with 0.1% Ca under excitation by 30 keV x-rays are compared in FIG. 1. No significant difference is observed due to the addition of Ca.

Figure 2:
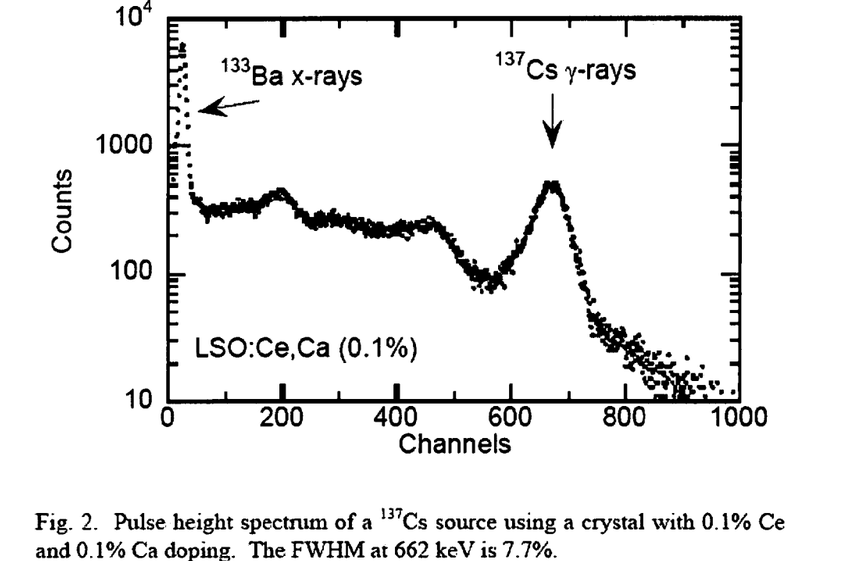
FIG. 2 is a graph showing pulse height spectrum of an irradiated LSO:Ce, Ca crystal in accordance with one preferred embodiment of the invention.

A typical pulse height spectrum of $^{22}Na$ using a 2×10×10 mm LSO:Ce:Ca crystal is shown in FIG. 2. By comparison with the single photoelectron signal and taking into account the emission spectrum of the crystal and the spectral response of the photomultiplier, absolute light yields as high as 39,300 have been measured; samples with 0.1 at % Ca measured in the current work have averaged 38,800 photons/MeV. The energy resolution at 662 keV is 7.7% and is still likely to be limited by a non-proportional energy response.

Figure 3:
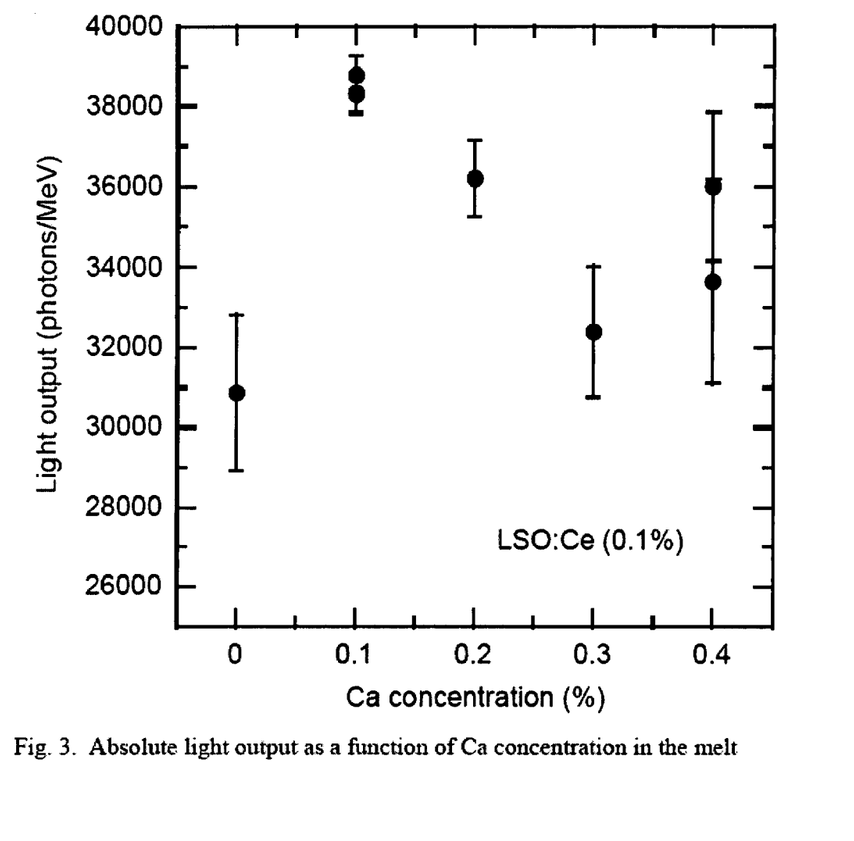
FIG. 3 is a graph showing light output of an LSO crystal as a function of Ca co-dopant concentration in a melt.

Light yield as a function of $Ca^{2+}$ concentration is shown in FIG. 3. The Ca doped crystals have up to 25% more light output when compared to the high quality Ce-only reference crystal. The best light yield was obtained for 0.1% Ca with the light yield decreasing gradually for crystals with higher Ca concentrations. The error bars represent the standard deviation of the individual samples within a boule. Repeatability of measurements on a single sample is ~3 ns. Thus, a first preferred embodiment of the invention, which maximizes light yield, provides for equimolar portions of calcium and cerium as co-dopants, with the amount of lutetium being reduced to accommodate the addition of calcium.

Figure 4:
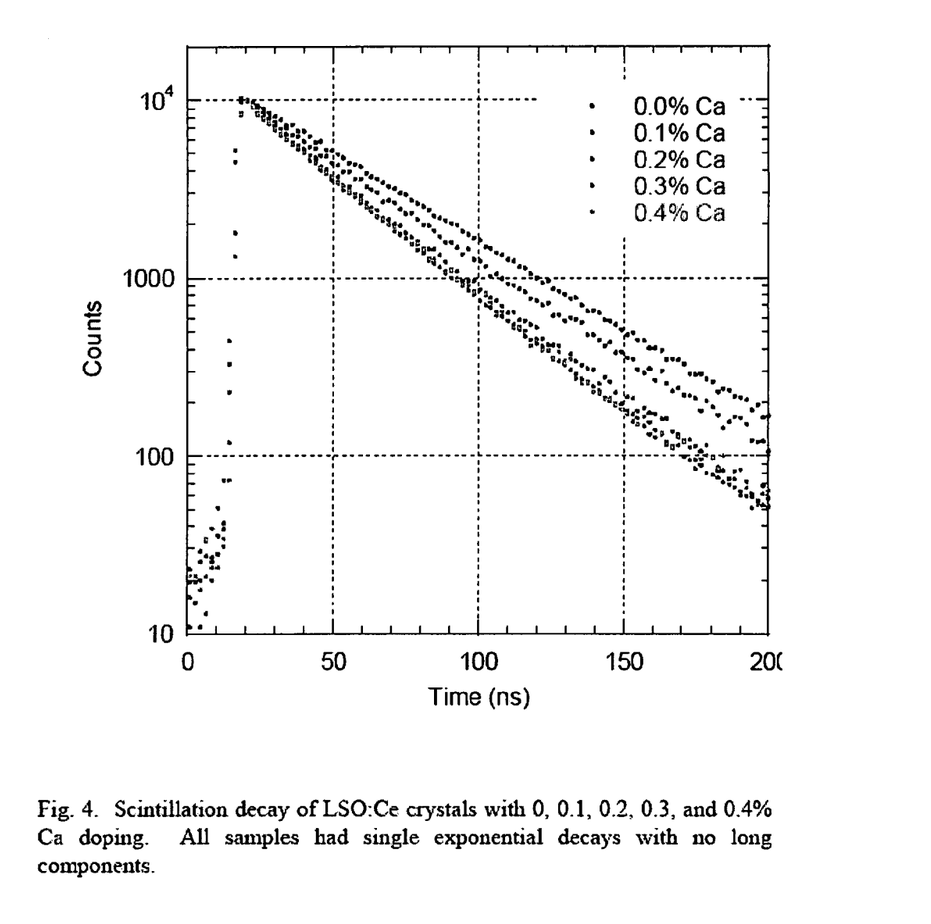
FIG. 4 is a graph illustrating decay time curves of LSO crystals in accordance with the invention, as a function of Ca co-doping concentrations.
Figure 5:
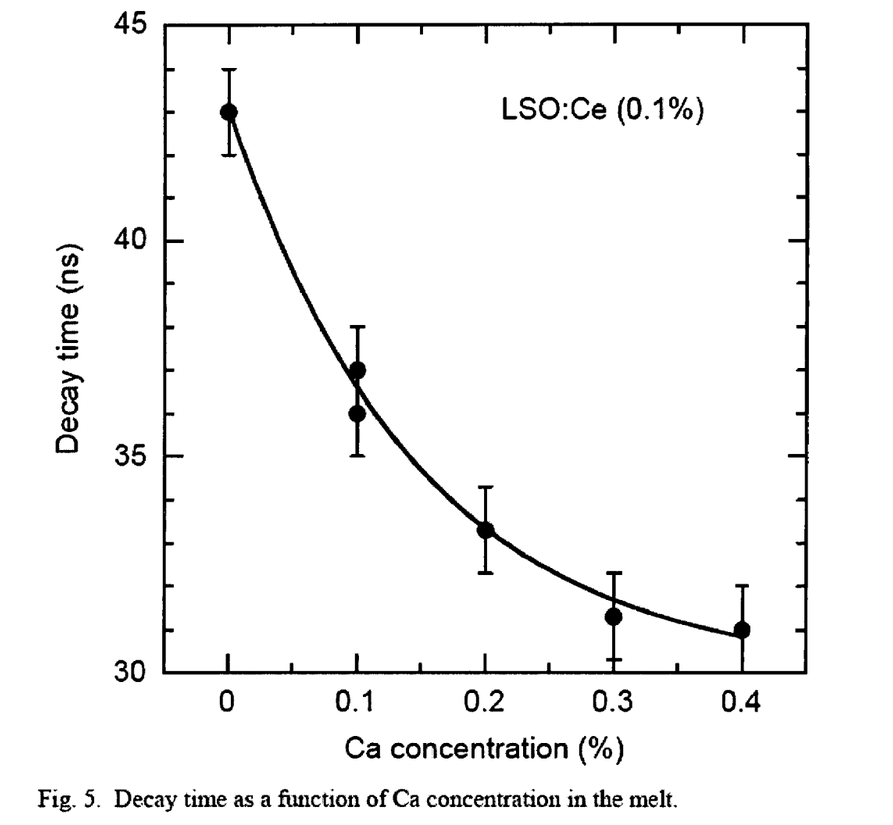
FIG. 5 is a graph illustrating decay times of LSO crystals in accordance with the invention, as a function of Ca concentration in the melt.

Decay time measurements for Ca doped crystals are compared to an LSO:Ce reference crystal in FIG. 4. The decay of each crystal can be characterized by a single exponential decay, although it is clear that the Ca doped crystals have significantly faster decays compared to LSO doped only with Ce. FIG. 5 shows how the decay constant decreases monotonically with increasing Ca concentration. Each point represents the average of multiple samples from a boule with a given Ca concentration. The error bars represent the standard deviation (~1 ns) of the individual samples within a boule. Repeatability of measurements on a single sample is ~0.5 ns. Crystals with 0.3-0.4% Ca have the fastest decay time of ~31 ns compared to 43 ns for LSO doped only with Ce.

Figure 6:
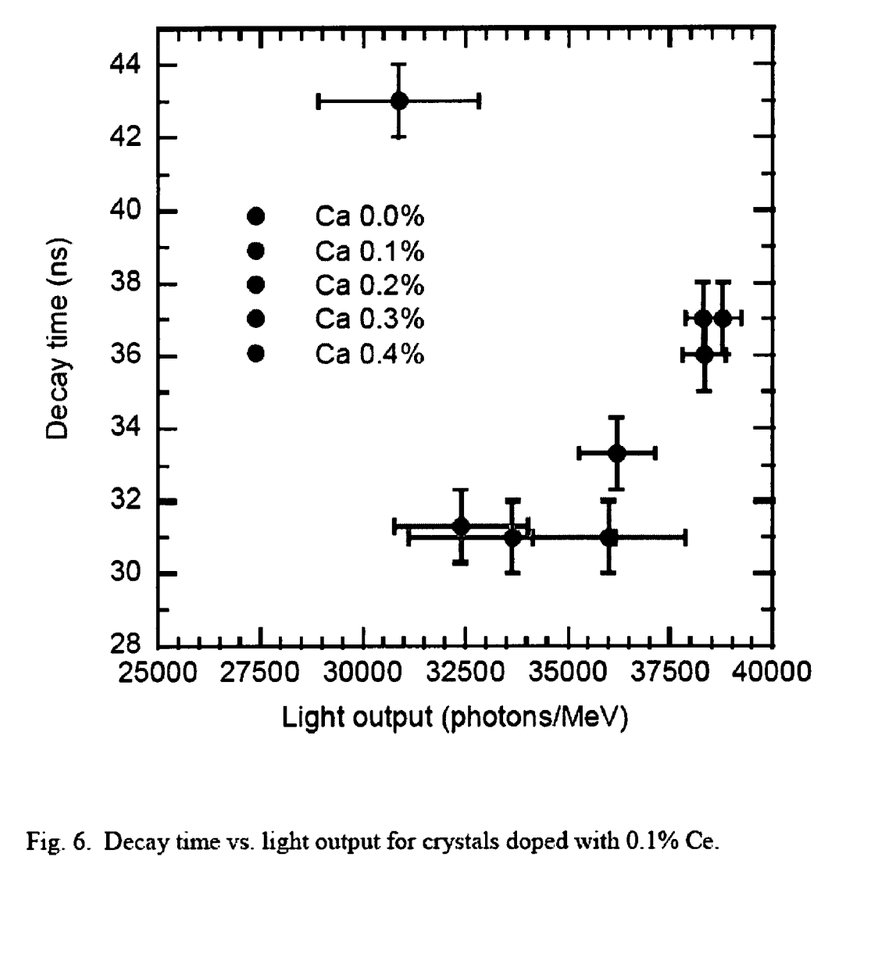
FIG. 6 is a graph comparing decay time v. light output for LSO crystals co-doped with various concentrations of Ca.

The relationship between decay time and light yield for Ca doped crystals is illustrated in FIG. 6. The error bars represent the spread of measurements on several samples of a given composition. A clear correlation is apparent in which the decay time becomes faster with decreasing light yield. The Ca doped crystals with the fastest decay time (31 ns) have light output higher than that of the reference crystal that has a decay time of 43 ns. The data are also listed in Table 1.

TABLE I

PROPERTIES OF LSO:CE, CA CRYSTALS

| Ca concentration (%) | Light output (photons/MeV) | Decay time (ns) |
| --- | --- | --- |
| 0.0 | 30900 | 43.0 |
| 0.1 | 38800 | 36.7 |
| 0.2 | 36200 | 33.1 |
| 0.3 | 32400 | 31.3 |
| 0.4 | 34800 | 31.0 |

Light output and decay time values are the average of multiple samples.

Figure 7:
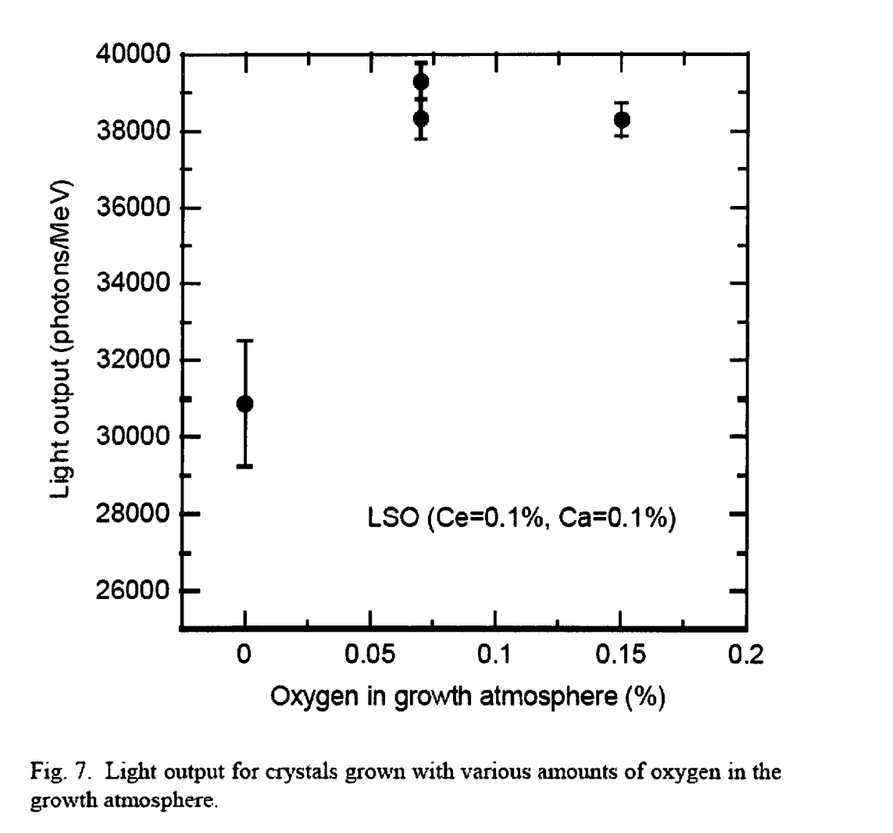
FIG. 7 is a graph illustrating light output of LSO crystals in accordance with the invention, as a function of amounts of oxygen in the growth atmosphere.

Crystals were grown with 0.1% Ce and 0.1% Ca doping in atmospheres containing various concentrations of oxygen. FIG. 7 shows the light output of 2×10×10 mm samples taken from each of these boules. Oxygen levels of ~0.7% and 0.15% produced nearly the same light output, while a pure nitrogen atmosphere, with no oxygen, resulted in significantly lower light yield. No effect of growth atmosphere on scintillation decay time was observed.

It should be noted that the invention is not limited to co-doping with calcium; additional or other divalent and monovalent co-dopants also could be used, including Ba, Mg, Li, Na, K, Sr, Zn, Sn, Pb, Cd and other similar elements. These elements may be in various forms, such as oxides, carbonates, etc.

In accordance with another aspect of the invention, stabilization of LSO:Ce crystal growth using a calcium co-dopant is achieved by using an additional co-dopant, such as zinc. While zinc was used in the experiments discussed below, other possibilities include Cd, PbO SnO, as well as group IB elements such as Cu.

In accordance with this aspect of the invention, cerium-doped LSO:Ce, LSO:Ce,Ca, LSO:Ce,Zn, and LSO:Ce,Ca,Zn single crystal boules, 32 mm in diameter and ~100 mm long, were grown via the Czochralski technique in a Cyberstar Oxypuller 05-03 growth station, with percentage Ca dopant as shown in Table 2 below. The $Lu_2O_3$, $SiO_2$, $CeO_2$, ZnO and CaO starting materials were at least 99.99% pure. In all experiments the nominal Ce concentration used was 0.1% relative to lutetium in the melt from which the crystal was grown; the actual concentration of the dopant in the crystal will differ from this value due to solid-liquid segregation and the fraction of melt solidified. Ca and Zn concentrations ranged up to 0.4 and 0.6%, respectively.

TABLE 2

List of Compositions

| | | |
| --- | --- | --- |
| 1 | LSO:Ce | 0 at % Ca |
| 2 | LSO:Ce:Ca | 0.1 at % Ca |
| 3 | LSO:Ce:Ca | 0.2 at % Ca |
| 4 | LSO:Ce:Ca | 0.3 at % Ca |
| 5 | LSO:Ce:Ca | 0.4 at % Ca |
| 6 | LSO:Ce:Zn | 0.1 at % Zn |
| 7 | LSO:Ce:Ca:Zn | 0.4 at % Ca |
| | | 0.2 at % Zn |
| 8 | LSO:Ce:Ca:Zn | 0.4 at % Ca |
| | | 0.4 at % Zn |
| 9 | LSO:Ce:Ca:Zn | 0.4 at % Ca |
| | | 0.6 at % Zn |

While co-doping with calcium has been shown to have a pronounced beneficial effect on scintillation properties of LSO:Ce, higher concentrations of calcium had a negative impact on growth stability. For example, while under the growth conditions used in the system LSO:Ce boules co-doped with up to 0.3 at % Ca exhibited stable growth with good diameter control, it was found that co-doping with 0.4% Ca produced a boule that grew severely off-axis and contacted the crucible as it rotated, necessitating early termination.

This off-axis growth occurred even though the crystal interface was convex, and there was no loss of contact between the growing crystal and the melt. Visual observation of the solid/liquid interface during and immediately after seed-dipping clearly showed that the meniscus size diminished in growth runs with high calcium concentration, indicating reduced surface tension. Additional experiments with ZnO showed the opposite effect, in that the meniscus enlarged when zinc was added, indicating increased surface tension.

Figure 8:
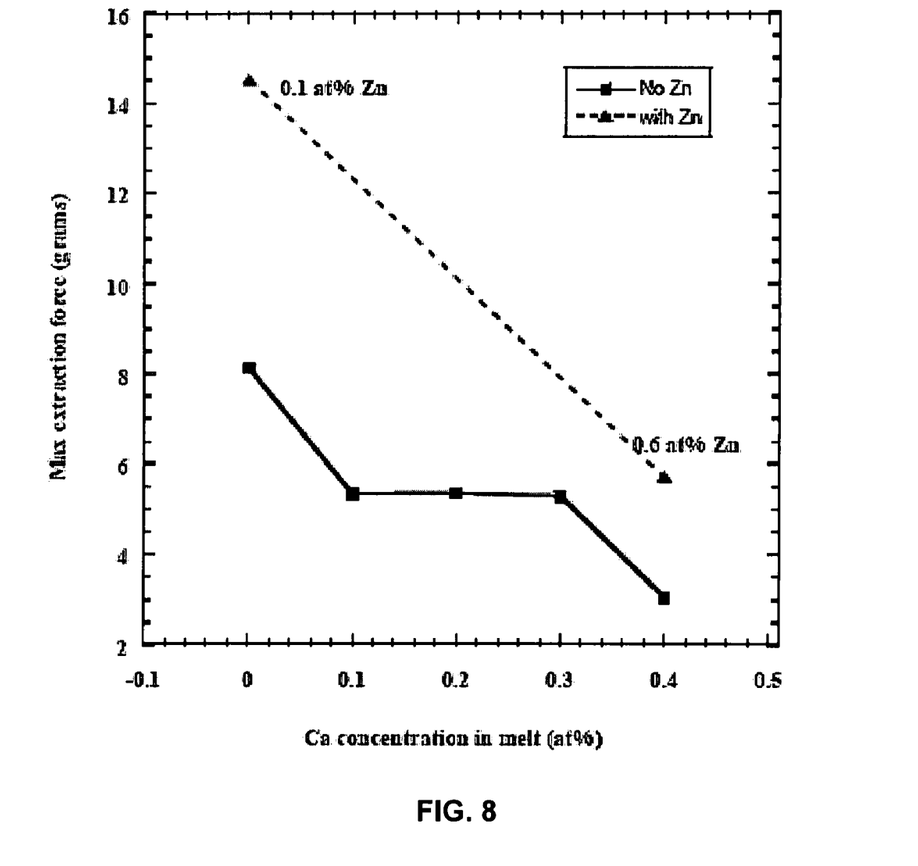
FIG. 8 is a graph showing maximum extraction force as a function of Ca concentration in the melt, with varying amounts of Zn added to stabilize growth, in accordance with another aspect of the invention.

Visual observations of the correlation between surface tension and Ca concentration were experimentally confirmed by measuring the force required to extract the boules from the melts. The measurements made in these experiments showed that the melt that required the most force for separation, i.e. the melt with the highest surface tension, contained 0.1 at % Zn, with no calcium; as shown in FIG. 8, this composition clearly had a higher surface tension than the reference boule, which was LSO:Ce with no co-doping. This is in contrast to the calcium co-doped boules, all of which required less force for separation than the boules without calcium. The boule doped with 0.4% calcium required the minimum force. However, the addition of Zn to this composition resulted in a significant increase in surface tension.

The addition of 0.2% Zn to a high calcium melt was enough to delay, but not suppress, the onset of acentric growth. It was necessary to add more Zn than Ca; as shown in FIG. 8, a 2:3 Ca:Zn ratio (i.e. 0.4t % Ca, 0.6% Zn) was sufficient to return to a surface tension compatible with stable growth. In summary, it has been found that calcium co-doping increases the light yield and shortens the decay time of LSO:Ce. By manipulating the calcium concentration, it is possible for the first time to pre-select the decay time of the finished crystals, within the range of ~28-43 ns; the shortest decay times are achieved by the highest calcium concentrations.

Table 3 below lists combinations of light yield and decay times achieved using various concentrations of Ca and Ca, Zn as co-dopants. As listed, a decay time as low as 28.5 ns has been achieved. It is anticipated that further experimentation in accordance with the invention as disclosed herein will achieve even shorter decay times.

TABLE 3

Scintillation properties obtained at each composition; each data point is the average of multiple samples.

| Dopant concentration (atomic %) | Light output (protons/MeV) | Decay time (ns) |
| --- | --- | --- |
| LSO:Ce, no co-dopant | 30900 | 43 |
| 0.1 Ca | 38800 | 36.7 |
| 0.2 Ca | 36200 | 33.3 |
| 0.3 Ca | 32400 | 31.3 |
| 0.4 Ca | 34800 | 31 |
| 0.1 Zn | 33200 | 40.1 |
| 0.4 Ca, 0.2 Zn | 29900 | 28.9 |
| 0.4 Ca, 0.4 Zn | 34700 | 30 |
| 0.4 Ca, 0.6 Zn | 29000 | 28.5 |

However, it was found that co-doping can have an impact on crystal growth stability due to changes in the melt surface tension. Co-doping can either have a stabilizing or a destabilizing effect, depending on the nature of the surface tension change. A reduction of surface tension in LSO, as happens in calcium co-doping, was found to be potentially destabilizing, while an increase in surface tension, as happens in zinc co-doping, tends to be stabilizing.

In summary, the present invention provides a method for achieving the production of LSO scintillation crystals with improved scintillation and optical properties as compared with the prior art. In addition to improved light yield and decay time performance, the present invention eliminates or minimizes the formation of undesirable color centers that are typical under certain common growth and post-growth processing conditions, such that the crystals remain colorless.

The foregoing description of an embodiment of the invention is for illustration purposes only. The scope of the invention is defined by the following claims.

What is claimed is:

1. A method of forming LSO scintillation crystals, comprising the steps of:
   forming a material mixture for the growth of an LSO crystal, having equimolar amounts of Ce and a co-dopant selected from the group consisting of Ca, Ba, Mg, Li, Na, K, and Sr;
   melting said mixture to form a melt; and
   growing a crystal from said melt from a seed crystal.

2. The method of claim 1, wherein said co-dopant is divalent calcium.

3. The method of claim 1, further comprising adding a predetermined amount of an element selected from the group of Zn, Sn, Pb and Cd to said material mixture.

4. The method of claim 1, further comprising controlling a growth atmosphere to contain a predetermined amount of oxygen.

5. The method of claim 4, wherein said amount of oxygen has a range of 0.1-5%.

6. The method of claim 1, wherein the atomic percent ratio of Ce is 0.1.

7. The method of claim 1, comprising the step of further varying the amount of co-dopant to vary the scintillation decay time of the resulting LSO crystal.

8. An LSO scintillation crystal made from the method of claim 1.

9. A method of forming an LSO scintillation crystal with controlled, selected scintillation decay times, comprising adding a non-rare-earth co-dopant to a material mixture containing cerium, from which said crystal is formed, wherein the concentration of the co-dopant is varied in accordance with a desired scintillation decay time of the LSO scintillation crystal.

10. The method of claim 9, wherein said co-dopant is $Ca^{2+}$.

11. The method of claim 10, wherein the cerium concentration is 0.1 atomic percent.

12. The method of claim 10, further comprising adding a predetermined amount of an element selected from the group of Zn, Sn, Pb and Cd to said material mixture.

13. The method of claim 9, further comprising controlling a crystal growth atmosphere to contain a predetermined amount of oxygen.

14. The method of claim 13, wherein said amount of oxygen has a range of 0.1-5%.

15. The method of claim 9, wherein said LSO scintillation crystal has a decay time of less than 38 ns.

16. The method of claim 9, wherein the co-dopant is $Ca^{2+}$, and wherein said crystal is formed by melting said mixture to form a melt; and growing a crystal from said melt from a seed crystal.

17. An LSO:Ce scintillation crystal doped with an additional, non-rare-earth element, the crystal having a decay time of less than 38 ns.

18. The LSO:Ce scintillation crystal of claim 17, wherein said decay time is on the order of 37 ns.

19. The LSO:Ce scintillation crystal of claim 17, wherein said decay time is less than 33 ns.

20. The LSO:Ce scintillation crystal of claim 19, wherein said decay time is on the order of 28.5 ns.

21. A method of forming LSO scintillation crystals, comprising the steps of:
   forming a material mixture for the growth of an LSO crystal, having predetermined amounts of Ce and $Ca^{2+}$;
   melting said mixture to form a melt; and
   growing a crystal from said melt from a seed crystal.

22. An LSO crystal formed from the method of claim 21.

23. A method of forming LSO scintillation crystals, comprising the steps of:
   forming a material mixture for the growth of an LSO crystal, having predetermined amounts of Ce and $Ca^{2+}$, and a predetermined amount of Zn;
   melting said mixture to form a melt; and
   growing a crystal from said melt from a seed crystal, in an environment containing a predetermined level of oxygen.

24. The method of claim 23, wherein said level of oxygen is in the range of 0.1-5%.

25. A method of forming LSO scintillation crystals, comprising the steps of:
   forming a material mixture for the growth of an LSO crystal, having predetermined amounts of Ce and a co-dopant selected from the group consisting of Ca, Ba, Mg, Li, Na, K, and Sr, without being silicon deficient;
   melting said mixture to form a melt; and
   growing a crystal from said melt.

26. The method of claim 25, wherein a predetermined amount of an element selected from the group consisting of group IB elements is added to said material mixture.

27. The method of claim 25, wherein a predetermined amount of an element selected from the group consisting of Zn, Sn, Cd and Pb is added to said material mixture.

28. The method of claim 25, further comprising controlling a crystal growth atmosphere to contain a predetermined amount of oxygen.

29. The method of claim 28, wherein said amount of oxygen has a range of 0.1-5%.

30. An LSO:Ce scintillation crystal having a decay time of less than 33 ns.

31. The LSO:Ce scintillation crystal of claim 30, wherein said decay time is on the order of 28.5 ns.

* * * * *